(12) United States Patent
Abbott

(10) Patent No.: US 6,834,361 B2
(45) Date of Patent: Dec. 21, 2004

(54) METHOD OF TESTING EMBEDDED MEMORY ARRAY AND EMBEDDED MEMORY CONTROLLER FOR USE THEREWITH

(75) Inventor: Robert A. Abbott, Ottawa (CA)

(73) Assignee: LogicVision, Inc., San Jose, CA (US)

( * ) Notice: Subject to any disclaimer, the term of this patent is extended or adjusted under 35 U.S.C. 154(b) by 591 days.

(21) Appl. No.: 09/888,607

(22) Filed: Jun. 26, 2001

(65) Prior Publication Data

US 2002/0194545 A1 Dec. 19, 2002

(30) Foreign Application Priority Data

Apr. 27, 2001 (CA) .............................. 2345605

(51) Int. Cl.$^7$ .............................................. G06F 11/00
(52) U.S. Cl. ...................................... 714/42; 714/718
(58) Field of Search .............................. 714/42, 5, 6, 7, 714/8, 29, 30, 53, 54, 718, 722, 769

(56) References Cited

U.S. PATENT DOCUMENTS

| | | | |
|---|---|---|---|
| 4,797,886 A | * | 1/1989 | Imada ......................... 714/718 |
| 5,173,906 A | | 12/1992 | Dreibelbis et al. |
| 5,467,358 A | | 11/1995 | Scarra |
| 5,633,877 A | | 5/1997 | Shephard, III et al. |
| 5,925,145 A | | 7/1999 | Illes et al. |
| 5,953,272 A | | 9/1999 | Powell et al. |
| 5,961,653 A | | 10/1999 | Kalter et al. |
| 6,009,546 A | * | 12/1999 | Kuglin et al. ................ 714/738 |
| 6,038,649 A | | 3/2000 | Ozawa et al. |
| 6,073,263 A | | 6/2000 | Arkin et al. |
| 6,108,797 A | | 8/2000 | Lin et al. |
| 6,108,798 A | | 8/2000 | Heidel et al. |
| 6,640,320 B1 | * | 10/2003 | Holaday ...................... 714/719 |

OTHER PUBLICATIONS

Zarrineh et al., "A New Framework for Automatic Generation, Insertion and Verification of Memory Built–In Self Test Units", Nov. 5, 1998, p. 1–25.
W.V. Huott, IBM J. Res Develop. vol. 41, No. 4/5, Jul./Sep. 1997, p. 616–619.

* cited by examiner

Primary Examiner—Dieu-Minh Le
(74) Attorney, Agent, or Firm—Eugene E. Proulx

(57) ABSTRACT

A memory test controller comprises a test instruction register array for storing a plurality of test instructions, each register having instruction fields for storing instruction data specifying operations to be performed on the memory array, a repeat module for repeating a group of one or more of the test instructions with modified data, the repeat module including storage means for storing instruction field modification data; and each register of the test instruction register array including an instruction field for enabling or disabling the repeat module.

28 Claims, 9 Drawing Sheets

METHOD OF TESTING EMBEDDED MEMORY ARRAY AND EMBEDDED MEMORY CONTROLLER FOR USE THEREWITH

The present invention relates, in general, to testing of memory arrays and, more specifically, to a method of efficiently repeating test instructions and to a test controller for use therewith.

BACKGROUND OF THE INVENTION

Memory BIST controllers use a very wide instruction word (e.g., 40 bits) for programming algorithms. A memory test developer may specify as many instructions as required in a memory BIST microprogram memory array to perform a memory test. However, since the developer wishes to keep the number of gates required to implement a word in the memory array to a minimum, it is desirable to keep the number of instructions to a minimum. Generally, each word requires about 250 gates.

Many memory test algorithms, particularly March algorithms, repeatedly perform the same operations but with opposite data or parameters or traverse an address space in one direction and then in the opposite direction. The conventional way of doing this utilizes many more instructions than are required. This requires many more gates than required.

Kalter et al U.S. Pat. No. 5,961,653 granted on Oct. 5, 1999 for "Processor based BIST for an embedded memory" describes a processor based BIST macro for testing memory embedded in logic and includes a base ROM which is structured to have test instructions written into it in microcode form. The base ROM component is configured having 160 addresses by 34 bits wide, providing for a total of 160 test instructions, branch statements to be used in conjunction with the instructions and a scannable ROM. The scannable ROM is configured having 34 addresses by 34 bits wide. The arrangement allows for altering, adding, deleting, changing the sequence of any test patterns and looping within a single pattern or any group of patterns. The 34 address lines in the scannable ROM allow for 17 branch instructions which bound the beginning and end of each test pattern produced from the base ROM and 17 extra instruction words to accommodate any modifications or changes. The scannable ROM addresses are typically sequenced from 192 through 225. The two ROMs and are multiplexed together onto a 34 bit test buss controlled by the sequencer.

Illes et al U.S. Pat. No. 5,925,145 granted on Jul. 20, 1999, for "Integrated circuit Tester with Cached Vector Memories" discloses an integrated circuit tester which includes a set of nodes providing test access to separate terminals of an IC and each carrying out a sequence of actions at the terminal in response to test vector sequences. Each node includes a low speed vector memory supplying test vectors during the test. A host writes vectors into the vector memories before the test sending them over a common bus to vector write caches within each node which compensate for access speed limitations of the vector memory. During the test, blocks of vectors are read out of the vector memory at a low rate and written into a high speed read cache array. An instruction processor within each node reads individual vectors read out of the read cache array at a high rate and uses them for controlling test operations at the node during each cycle of the test. The read cache array also allows the instruction processor to re-use repeated vector patterns, thereby reducing the number of vectors that must be distributed to the nodes.

Ozawa et al. U.S. Pat. No. 6,038,649 granted on Mar. 14, 2000 for "Address Generating Circuit for Block Repeat Addressing for a Pipelined Processor" discloses an address generating circuit for repeating a selected block of instructions. An instruction address maintained by a program counter is compared to register that holds the address of the end of the selected block of instructions. When the end address is detected, the program counter is loaded with a starting address of the block of instructions. A Block repeat count register maintains a repeat count. A zero detection circuit delays decrements by a number of clock cycles that is equivalent to a pipeline depth for instruction prefetching of a processor connected to the program counter. The zero detection circuit outputs a loop-end control signal which controls a selector to selectively provide an incremented address or the start address to the program counter. By delaying decrements, the state of the repeat count is correctly maintained when the processor pipeline is flushed during an interrupt. The zero detection circuit also deactivates the loop-end control signal for the number of clock cycles equivalent to the depth of the pre-fetch pipeline during the final repeat loop iteration(s) so that a loop with a block size less than or equal to the depth of the prefetch pipeline can be repeated the correct number of times.

Heidel et al U.S. Pat. No. 6,108,798, granted on Aug. 22, 2000 for "Self programmed built in self test, discloses a Dynamic Random Access Memory (DRAM) with self-programmable Built In Self Test (BIST). The DRAM includes a DRAM core, a Microcode or Initial Command ROM, a BIST Engine, a Command Register and a Self-Program Circuit. During self test, the BIST engine may test the DRAM normally until an error is encountered. When an error is encountered, the Self-Program Circuit restarts the self test procedure at less stringent conditions.

SUMMARY OF THE INVENTION

The present invention provides a method for repeating an instruction or a series of consecutively executed instructions with modifications to the instruction fields of each commands as well as a circuit especially adapted to carry out the method.

One aspect of the invention is generally defined as a method for testing memory embedded in an integrated circuit, the method comprising executing each instruction of a plurality of test instructions in sequence, each instruction having an inactive repeat control field except for a last instruction of each of one or more groups of one or more instructions to be repeated, each of the last instruction having an active repeat control field; and, for each instruction having an active repeat control field, executing, in sequence, the instructions of the group of instructions with which each instruction is associated for a predetermined number of repeat cycles for the group; and, for each repeat cycle, modifying predetermined fields of each instruction in accordance with a predetermined field modification instructions for each repeat cycle.

Another aspect of the invention is generally defined as an memory improvement to a test controller for testing a memory array, the controller having a test instruction register array having registers for storing a plurality of test instructions, each register having instruction fields for storing memory addressing sequencing data, write data sequencing data, expect data sequencing data and operation data specifying an operation to be performed on the memory array, the improvement comprising a repeat module for repeating a group of one or more test instructions with modified data, the repeat module including storage means for storing instruction field modification data; and each register of the test instruction register array including an instruction field for enabling or disabling the repeat module.

A still further aspect of the present invention is generally defined as a test controller for use in testing memory imbedded in an integrated circuit, the test controller comprising a scannable microcode register array having one or more instruction registers for storing a plurality of test instructions for performing a test of the memory in accordance with a predetermined test algorithm; a pointer controller for selecting one of the test instructions for execution and determining a next instruction for execution in accordance with conditions stored in each the test instruction; an instruction repeat module for reading address sequencing, write data sequencing, expect data sequencing data from a current test instruction and outputting address sequencing, write data sequencing, expect data sequencing data, the repeat module being responsive to instruction repeat data in the current test instruction for repeating an operation specified in the test instruction with different data; a sequencer responsive to an operation code in the current instruction for performing a predetermined operation on the memory under test; and an address generator and a data generator responsive to the output address sequencing, write data sequencing, expect data sequencing data for application to a memory under test in accordance with an operation specified in the current instruction.

BRIEF DESCRIPTION OF THE DRAWINGS

These and other features of the invention will become more apparent from the following description in which reference is made to the appended drawings in which.

DETAILED DESCRIPTION

Figure 1:
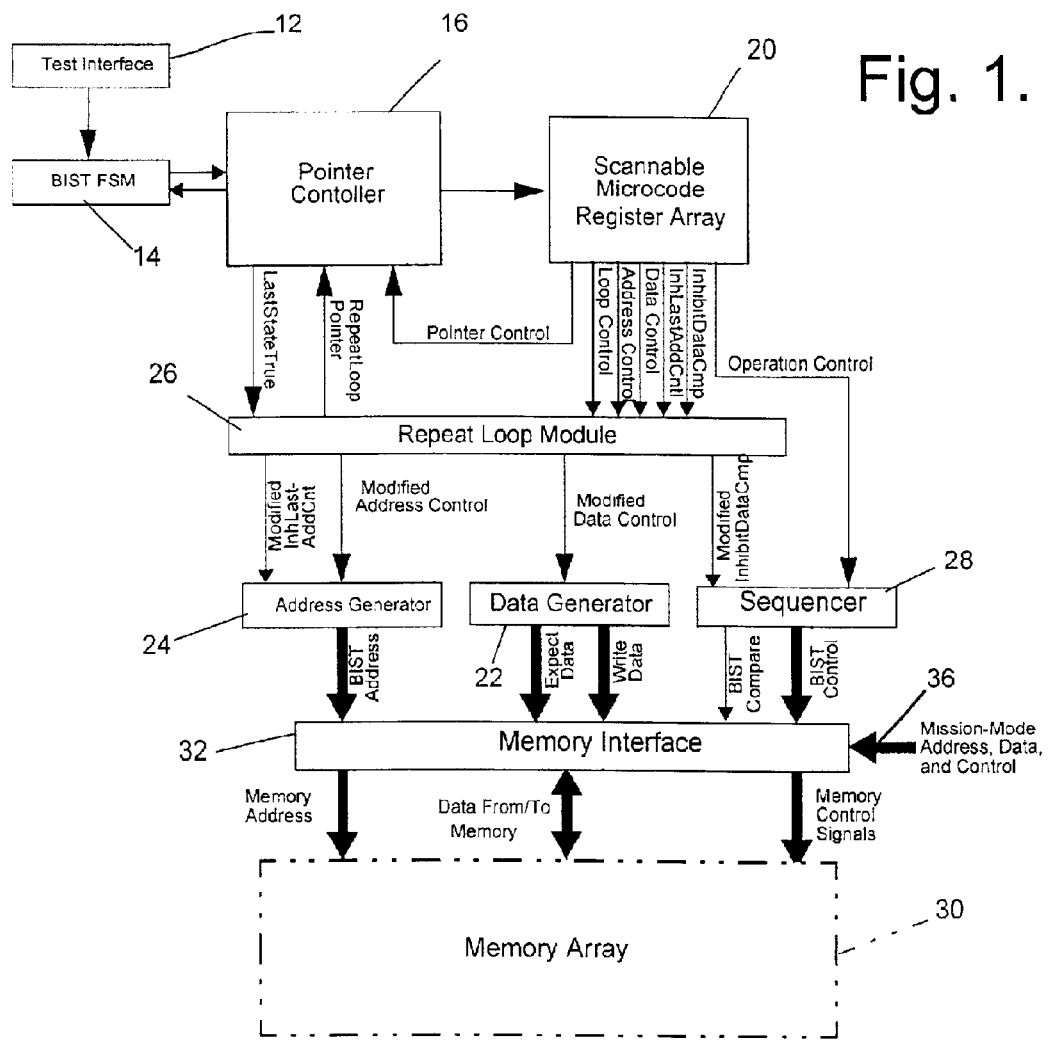
FIG. 1 is a block diagram view of a portion of a memory test controller including a Repeat Loop microcircuit according to an embodiment of the present invention.

FIG. 1 is a block diagram of portion of a memory test controller 10 according to a preferred embodiment of the present invention in which the test controller is embedded in an integrated circuit. The circuit includes a test interface 12 for loading test instructions and data into the circuit, a Finite State Machine (FSM) 14 which controls the initialization, setup, and initiation of a memory test, a pointer controller 16 which controls the sequencing of test instructions, and a scannable microcode register array 20 for storing a plurality of test instructions, as discussed more fully below. The test controller further includes a data generator 22 and an address generator 24 which operate to execute data and address commands in response to data fields in an active or current microcode instruction which has been loaded for execution, as explained below. A repeat loop module 26 reads the instruction fields of the current instruction and generates memory address and data control signals which are applied to the data generator and address generator. Address generator 24 controls the sequencing of the addresses applied to the memory under test. Data generator 22 provides a programmable write data register (not shown) and a programmable expect data register (not shown). A number of operations can be performed at runtime on these registers to generate a custom data pattern. The write data register controls the data pattern written to the memory under test. The expect data register controls the expected data pattern used to compare with data read from the memory under test. The data and address generators operate independently and are controlled by respective fields of the active microprogram instruction. A sequencer 28 is responsive to an operation field contained in a current test instruction for performing a specified one of a plurality of predetermined operations on the memory under test. Memory address, control signals and data are applied to the memory under test 30 via a memory interface 32 which also observes data from the memory under test. In normal operational mode of the circuit, address, data and control signals are applied to the memory interface via inputs generally designated by arrow 36. Data generators, address generators, sequencers and memory interfaces are well known in the art and, accordingly, are not described in detail herein.

Scannable Microcode Register Array

Figure 3:
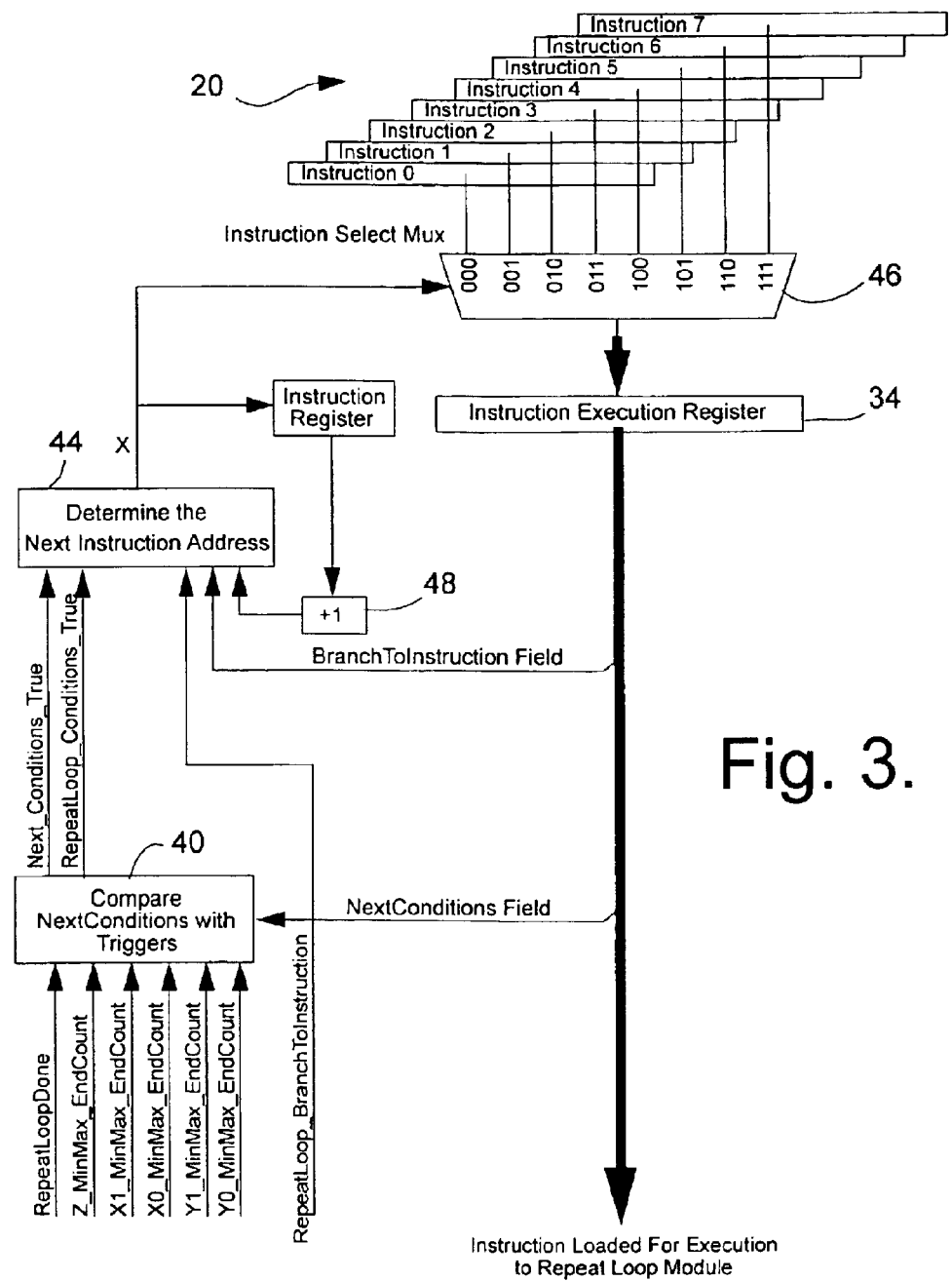
FIG. 3 is a block diagram illustrating salient portions of a pointer controller and a scannable microcode memory array according to an embodiment of the present invention.

Scannable microcode register array 20 is comprised of a plurality of serially connected instruction shift-registers. For purposes of illustration, eight registers are shown in FIG. 3. The number of instructions in the array depends on the specific design requirements and design budget. Each register may be in the order of 34 or more bits and stores a microcode test instruction for execution. The instructions are "ordered" which means that the instructions are executed in sequence. The first address is instruction zero. The instructions stored in the registers perform tests of the memory according to predetermined test algorithms under the control of the pointer controller and the repeat loop module and in accordance with command fields contained in the instructions. An objective of the invention is to enable one to scan in instructions to perform memory tests according to virtually any test algorithm. Thus, the details of the algorithm and of the manner in which data pattern and address sequencing is achieved is not important for the purposes of the present invention and, accordingly, are not described herein.

Test instructions are serially loaded into the scannable microcode register array 20 via test interface 12. One instruction is executed for each execution of an operation applied to the memory under test by the sequencer. The microcode instructions of the memory BIST controller provide parallel control of blocks such as the address generator, data generator, sequencer and pointer controller, creating a wide but very flexible architecture for the generation of complex test algorithms. The contents of the test instructions in the scannable microcode register array are not modified during a test. The pointer controller, described in more detail later, operates to select an instruction,for execution and determines the branch for execution of the next instruction from data contained in each test instruction. Before describing the structure and operation of the various sub-circuits of the test controller, it would be useful to briefly describe the various instruction fields which comprise a microcode instruction. It is to be understood at the outset that additional fields may be provided without departing from the present invention.

Microcode Instruction Field Descriptions

Each instruction includes at least the following instruction fields: Address sequencing commands, including Z, X1, X0, Y1, Y0 address segment fields (referred to as Z__Address__Cmd, X1__Address__Cmd, X0__Address__Cmd, Y1__Address__Cmd, Y0__Address__Cmd, respectively, later in the description); OperationSelect; InhibitLastAddress-Count; InhibitDataCompare; WriteDataCmd; ExpectDataCmd; BranchToInstruction; and RepeatLoopControl and NextConditions.

Each instruction provides a 2-bit instruction field for each of a Z bank address segment control field, X1 and X0 row address segment control fields and Y1 and Y0 column address segment control fields for the memory under test. TABLE I shows the address segment control field decodes which apply to all of these fields. Actions such as increment or decrement can be performed on each address segment independently. The decodes are arranged in pairs so that a command can be changed to its opposite or complement value simply reversing the least significant bit.

TABLE I

Address Segment Control Field Decode

| Field Value | Instruction Description |
|---|---|
| 00 | Hold |
| 01 | Hold |
| 10 | Increment |
| 11 | Decrement |

The InhibitLastAddressCount field is a single bit field which, when active, prevents an address counter from counting the next address on a True NextConditions.

The WriteDataCmd control field is a 3-bit field which is decoded to select the data or perform an operation on a data register which is applied to the memory for a write operation. It will be noted that the decodes are arranged in pairs in which the only difference between the bit values of members of the pairs is the values of the least significant bit. The repeat loop module uses this characteristic in a manner explained later. The field decode is shown in TABLE III.

TABLE III

WriteDataCmd Instruction Field Decode

| Field Value | Instruction Description |
|---|---|
| 000 | Select the WriteData Register |
| 001 | Select the WriteData Register and Invert |

TABLE III-continued

WriteDataCmd Instruction Field Decode

| Field Value | Instruction Description |
|---|---|
| 010 | Select the register containing all zeroes |
| 011 | Select the register containing all ones |
| 100 | Select and Rotate the WriteData Register |
| 101 | Select and Rotate the WriteData Register and Invert |
| 110 | Select and Rotate the WriteData Register with Inverted feedback |
| 111 | Select and Rotate the WriteData Resister with Inverted feedback and Invert |

The ExpectDataCmd instruction field is a 3-bit field which is decoded to select the expect data or to perform an operation on an expect data register for comparison on a read operation. The ExpectDataCmd field decodes are identical to the WriteDataCmd field and are shown in TABLE IV.

TABLE IV

ExpectDataCmd Instruction Field Decode

| Field Value | Instruction Description |
|---|---|
| 000 | Select the ExpectData Register |
| 001 | Select the ExpectData Register and Invert |
| 010 | Select the register containing all zeroes |
| 011 | Select the register containing all ones |
| 100 | Select and Rotate the ExpectData Register |
| 101 | Select and Rotate the ExpectData Register and Invert |
| 110 | Select and Rotate the ExpectData Register with Inverted feedback |
| 111 | Select and Rotate the ExpectData Resister with Inverted feedback and Invert |

The InhibitDataCompare field is a single-bit instruction field which, when set, disables any StrobeDataOut signal during execution of the specified operation. When not set, normal comparison of expected data and read data from the memory under test is performed.

The OperationSelect field specifies the operation to be applied to the memory under test. The length of the OperationSelect field is dependant on the number of operations defined by the test algorithm designer. This field is applied to and used by the sequencer which is designed to perform all of the desired operations.

The BranchToInstruction field identifies the instruction which the pointer control selects as the next instruction for execution if any of the requested NextConditions triggers, apart from the RepeatLoopDone condition, are not true.

The RepeatLoopControl instruction field is a 2-bit field with an instruction decode given below. As explained more fully later, the repeat loop module includes the 2-bit counters. As indicated in the RepeatLoopControl field decodes shown in TABLE II, each counter can be incremented separately or the two counters may be chained together to form one 4-bit counter and incremented sequentially. Thus, the instruction decode from the RepeatLoopControl field defines the counter configuration. The RepeatLoopDone condition, described below, is always required to increment a repeat operation if the instruction decode from the RepeatLoopControl field is increment Loop Counter A, Increment Loop Counter B, or Increment Loop Counter BA.

TABLE II

RepeatLoopControl Field Decode

| Field Value | Instruction Description |
|---|---|
| 00 | Idle |
| 01 | Increment Loop Counter A |
| 10 | Increment Loop Counter B |
| 11 | Increment Loop Counter BA |

The NextConditions instruction field defines the conditions which must test true to advance to the next instruction. The next instruction is the next sequential instruction in the scannable microcode register array. The conditions in the NextConditions field include the following conditions: Z__Endcount; Y0__Endcount; Y1__Endcount; X0__Endcount; X1__Endcount; and RepeatLoopDone. Each of these conditions is briefly described below. An unconditional NextConditions is implied when all of the bits of the NextConditions field are set to zero. The NextConditions conditions are as follows:

the Z__Endcount condition specifies whether the Z__Endcount trigger is a required condition for advancing to the next instruction. The Z__Endcount trigger is True if the z__address instruction field is set to increment and the z__address segment has reached the maximum of a predetermined bank address count range, or the z__address instruction field is set to decrement and the z__address has reached the minimum of a predetermined bank address count range.

The Y0__Endcount condition specifies whether the Y0__endcount trigger is a required condition for advancing to the next instruction. The Y0__endcount trigger is true if the Y0 address instruction field is set to increment and the Y0 address segment has reached a predetermined maximum of the column address count range, or the Y0 address instruction field is set to decrement and the Y0 address segment has reached a predetermined minimum of the column address count range.

The Y1__Endcount condition specifies whether the y1__endcount trigger is a required condition for advancing to the next instruction. The Y1__endcount condition is true if the Y1 address instruction field is set to increment and the Y1 address segment has reached a predetermined maximum of the column address count range, or the Y1 address instruction field is set to decrement and the Y1 address segment has reached a predetermined minimum of the column address count range.

The X0__Endcount condition specifies whether the X0__endcount trigger is a required condition for advancing to the next instruction. The X0__Endcount condition is true if the X0 address instruction field is set to increment and the X0 address segment has reached a predetermined maximum of the row address count range or the X0 address instruction field is set to decrement and the X0 address segment has reached a predetermined minimum of the row address count range specified in the count range.

The X1__Endcount condition specifies whether the X1__Endcount trigger is a required condition for advancing to the next instruction. The X1__Endcount condition is true if the X1 address instruction field is set to increment, and the X1 address segment has reached a predetermined maximum of the row address count range or the X1 address instruction field is set to decrement and the X1 address segment has reached a predetermined minimum of the row address count range.

The RepeatLoopDone condition specifies that one or both of two repeat loop counters equals maximum count values based on a LoopCountAMax or a LoopCountBMax registers and indicates the end of a repeat operation. These registers are described later in the description of the repeat loop module.

It will be understood that other the field decodes may be altered from that shown above and that other fields may be included in the instructions without departing from the spirit of the present invention.

Pointer Controller

Figure 2:
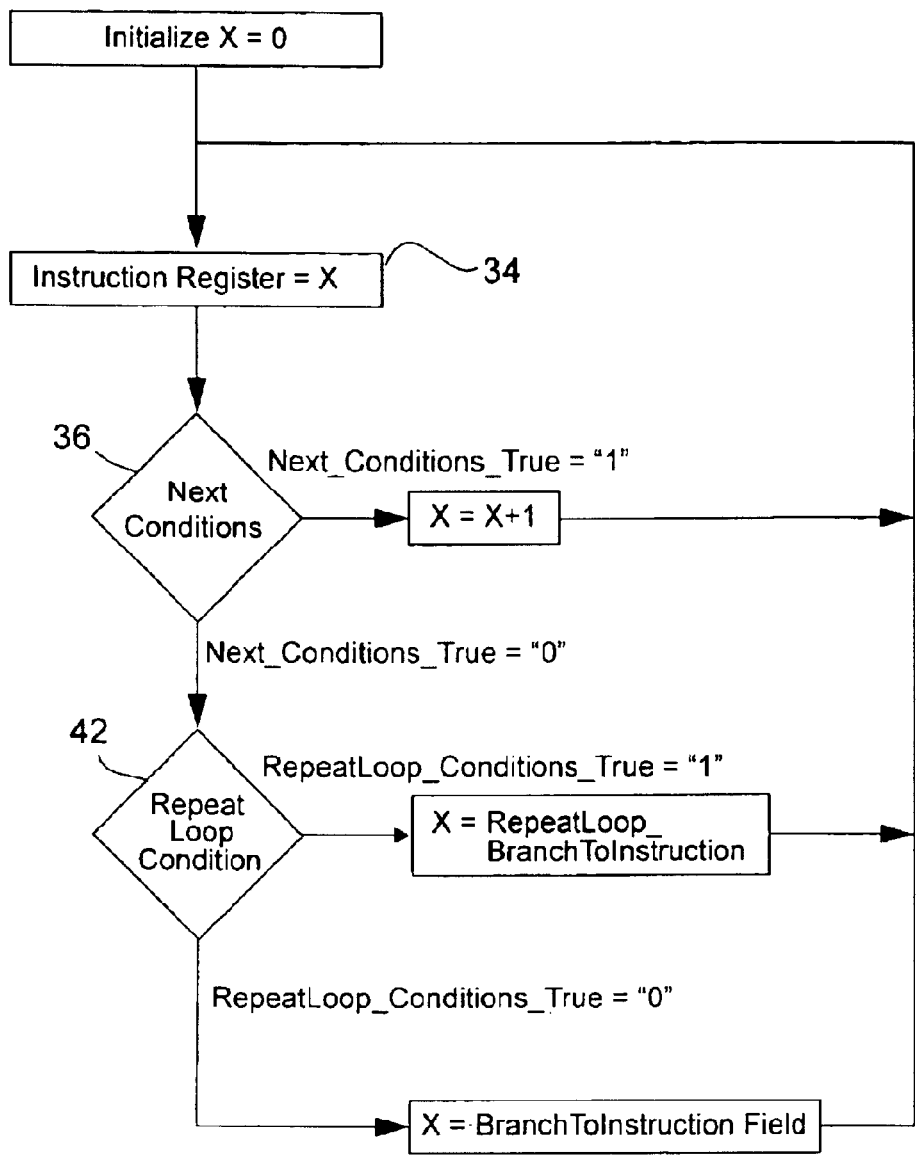
FIG. 2 is a flow diagram partially illustrating the operation of a pointer controller according to an embodiment of the present invention.

The pointer controller operates to select an instruction for execution and determine the branch or next instruction for execution. Determination of the branch is based on the content of the NextConditions conditions, repeat loop module condition and the BranchToInstruction pointer field of the current instruction. FIG. 2 illustrates the branch decision tree of the pointer controller. As illustrated, the prioritization of testing conditions for determining the branch are as follows, from highest priority to lowest priority:

NextConditions: Advance the instruction address pointer by one;

Repeat Loop Conditions: Branch to the instruction address specified in a repeat loop module BranchToInstruction register;

Branch To Instruction: Branch to the instruction identified by the BranchToInstruction field in the executing instruction. As shown in FIG. 2, an instruction is loaded into an instruction execution register 34. The first instruction loaded is instruction zero. The NextConditions field of the current instruction is applied to a NextConditions compare block 36 which compares the NextConditions trigger signals. When the trigger signals satisfy the predetermined values in the current instruction, a NextConditions__True flag is set to logic 1. This causes the instruction address to be incremented and the next instruction in sequence to be loaded into instruction execution register 34. Otherwise, the NextConditions__True flag is set to logic 0 and control passes to a Repeat Loop Conditions compare block 42. Block 42 compares the content of the RepeatLoopControl field of the current instruction against the RepeatLoopControl decodes shown in TABLE II. If it matches one of the three RepeatLoopControl decodes, 01, 10, and 11, a RepeatLoop__Conditions__True signal is set to logic 1 and the instruction at the appropriate RepeatLoop__BranchToInstruction address is selected and the corresponding instruction is loaded into instruction execution register 34. Otherwise, signal RepeatLoop__Conditions__True is set to logic 0 and the address specified in the BranchToInstruction field of the current instruction is loaded into the instruction address register and the corresponding instruction is loaded into instruction execution register 34.

Figure 7:
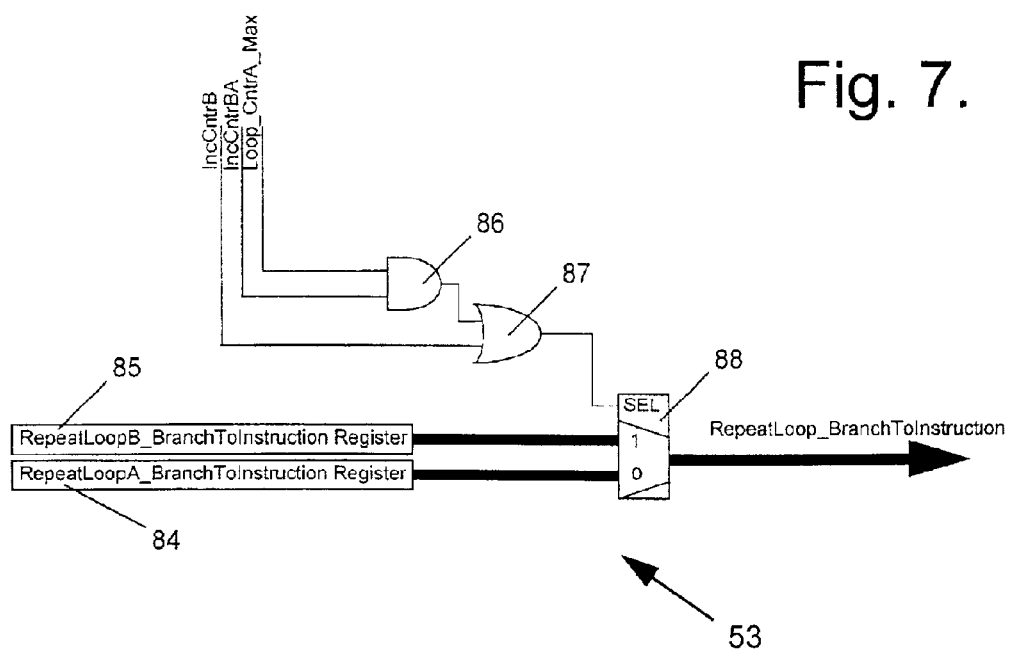
FIG. 7 is a circuit diagram of a repeat register data processing sub-circuit according to an embodiment of the present invention.

FIG. 3 is a block diagram of the architecture of the pointer controller 16. The Figure illustrates microcode array 20 as having eight instruction registers labeled "Instruction 0" through "Instruction 7". An instruction select multiplexer 46 is responsive to the output of a Next Instruction Determining Block 44. The figure further illustrates instruction execution register 34, instruction address register 38, and NextConditions compare block 40. Compare block 40 outputs the aforementioned RepeatLoop__Conditions__True signal and the Next__Conditions__True signal to block 44. The contents of the NextConditions field of the instruction in register 34 are applied to block 40 and the contents of the BranchToInstruction field of the current instruction are applied to block 44. A RepeatLoop__BranchTo-Instruction address output by the repeat loop module, as described later with reference to FIG. 7, is applied to block 44. Finally, the address of the current instruction is incremented at 48 and applied to block 44. The microprogram address is always initialized to address "zero" (Instruction 0) prior to executing any of the microcode instructions. A LastStateDone signal is returned to the Finite State Machine on a True NextConditions when a microprogram address has completed execution of the last available instruction.

Repeat Loop Module

Repeat loop module 26 provides optimal coding for redundant or symmetric sub-test sequences. Without the repeat loop module, a much larger number of instructions would be required to perform a memory test. The repeat loop module is used to repeat execution of a group of one or more sequential instructions. A group of sequential instructions includes the instructions between and including an instruction specified by a repeat loop module BranchToInstruction register and the instruction which initiates the repeat operation. This group of sequential instructions is re-executed a plurality of times, with each instruction being modified in accordance with a set of modification commands for each repeat sequence or cycle. The repeat loop module may include one or more repeat loop circuits described later. The specific embodiment illustrated herein includes two repeat loop circuits.

Modification Commands

In the embodiment illustrated herein, the modification commands comprise a set of five bits, one bit for each of Address sequencing, WriteData sequencing, ExpectData sequencing, InhibitDataCompare and InhibitLastAddressCount fields. Each modification bit has a value of logic 0 or logic 1. The modification bit for the address segment, WriteDataCmd and ExpectDataCmd fields, a value of logic 0 means that the instruction field is to remain unchanged. A value of logic 1 means to the least significant bit of a corresponding instruction field is to be changed to its complimentary value. When set to logic 1, the InhibitLastAddressCount modification bit overrides the InhibitLastAddressCount instruction field for the instruction containing the corresponding RepeatLoopControl command. The InhibitDataCompare modification bit overrides the InhibitDataCompare Instruction bit for all instructions which form part of the group of repeated instructions.

The single address sequence modification bit applies to all of the address segment instruction fields and specifies that each of the address segment commands executed by instructions during a repeat operation will either be executed as specified by the instruction field or the command will be modified to a complimentary command. Similarly, WriteDataCmd and ExpectDataCmd modification bits specify that the WriteDataCmd and ExpectDataCmd fields, respectively, executed by instructions during a repeat operation will either be executed as specified by the instruction or the command will be modified to a complimentary command.

The InhibitLastAddressCount modification bit provides for a reverse address sequence on the next instruction without requiring an additional instruction to change the address pointer. Valid values are logic 0 by which any address segment command to increment or decrement is executed normally and logic 1 which prevents a selected address register from counting on the last execution of the selected instruction when all requested NextConditions are True and the next sequential instruction is loaded for execution.

The InhibitDataCompare modification bit overrides the InhibitDataCompare instruction field. Valid values are logic 0 where expected data and read data are compared normally and logic 1 by which any StrobeDataOut signal is disabled, and the expect data and read data are not compared.

Repeat Procedure

A repeat procedure comprises executing, in sequence, a previously executed instruction or a group of sequentially executed instructions for a predetermined number of repeat cycles. The first execution of an instruction or a group of sequential instructions is performed unmodified, i.e., as the instruction was programmed.

To cause an instruction or a group of sequential instructions to be repeated, the last instruction of the group is arranged such that its RepeatLoopDone bit is set to "1" and its RepeatLoopControl field is set to the appropriate one of the three loop incrementing codes shown in TABLE II, i.e., "01", "10" or "11". In all other instructions of the group, including the first instruction, the RepeatLoopDone bit is set to "0" and the RepeatLoopControl field is set to Idle, "00"; the address of the first instruction of the group is stored in a repeat loop branch-to-instruction register; a value indicating the number of repeat sequences or cycles to be performed is stored in a maximum count register; and a set of modification bits for each repeat sequence is stored in a corresponding or associated modification bit register.

To cause one group of instructions to be nested within another group, the same steps are performed for the second group, using a separate repeat loop branch-to-instruction register, maximum count register, and modification bit registers.

When the last instruction of a repeat operation is loaded, the RepeatLoopControl specified in the last instruction is performed. This causes the instruction specified in the repeat loop branch-to-instruction to be loaded and executed, followed by the loading and execution of all subsequent instructions until the last instruction is again loaded. This operation continues until the number of repeat sequences equals the value stored in the maximum count register.

In the first repeat cycle, the instructions in the group are executed without modification. On each subsequent repeat cycle, instruction fields are modified according to a corresponding set of modification bits. When more than one repeat operation is in progress, the manner in which instruction fields are modified must be adjusted to accommodate the modification bits specified for the two or more active repeat operation. This is described in detail later with reference to FIGS. 8–10. An instruction has completed execution when the sequencer has completed the operation specified in the OperationSelect field of the current instruction. The sequencer signals completion of the operation by generating an active LastTick signal.

Repeat Loop Module Structure

Figure 4:
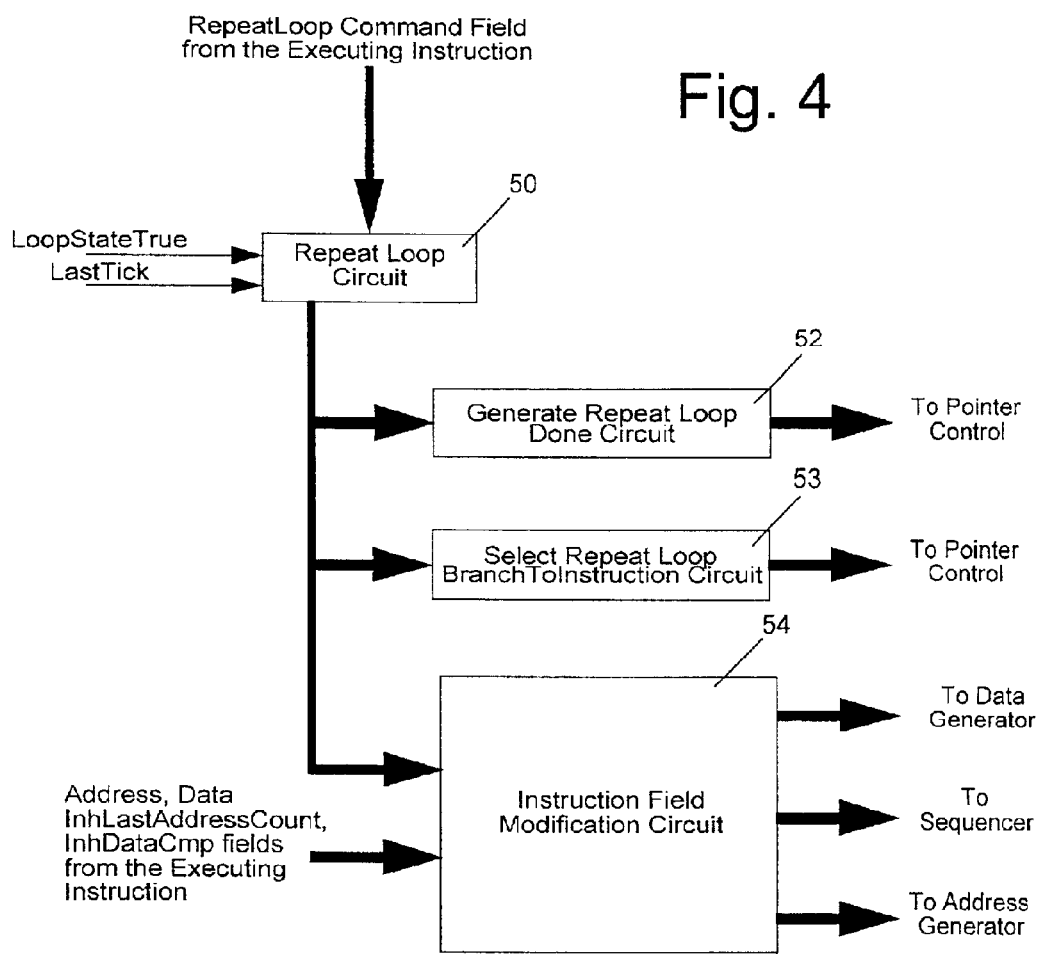
FIG. 4 is a block diagrammatic view of a repeat loop module according to an embodiment of the present invention.

FIG. 4 Illustrates a block diagram of a Repeat Loop Module according to a preferred embodiment of the present invention. Repeat loop module 26 generally comprises a Repeat Loop Circuit 50, a Generate Repeat Loop Done circuit 52, a select repeat loop BranchToInstruction circuit 53, and an instruction field modification circuit 54. The 2-bit RepeatLoopControl field is input to the repeat loop circuit 50 which decodes and executes the code. The two other inputs to repeat loop circuit 50 are the RepeatLoop_Conditions_True signal from the pointer control module 16 and the LastTick signal from sequencer module 28. The RepeatLoopControl field also controls generate repeat loop done circuit 52 and instruction field modification circuit 54. Generate repeat loop done circuit 52 generates the RepeatLoopDone signal which is used by the Pointer Controller 16. The RepeatLoopDone signal remains inactive until a RepeatLoopControl has reached the last repeat cycle at which point the RepeatLoopDone signal becomes active and remains active until the selected repeat loop is reset. Select repeat loop BranchToInstruction circuit 53 specifies the instruction pointer used by Pointer Controller 16 to determine the next instruction to be loaded into the instruction execution register.

Repeat Loop Circuit

Figure 5:
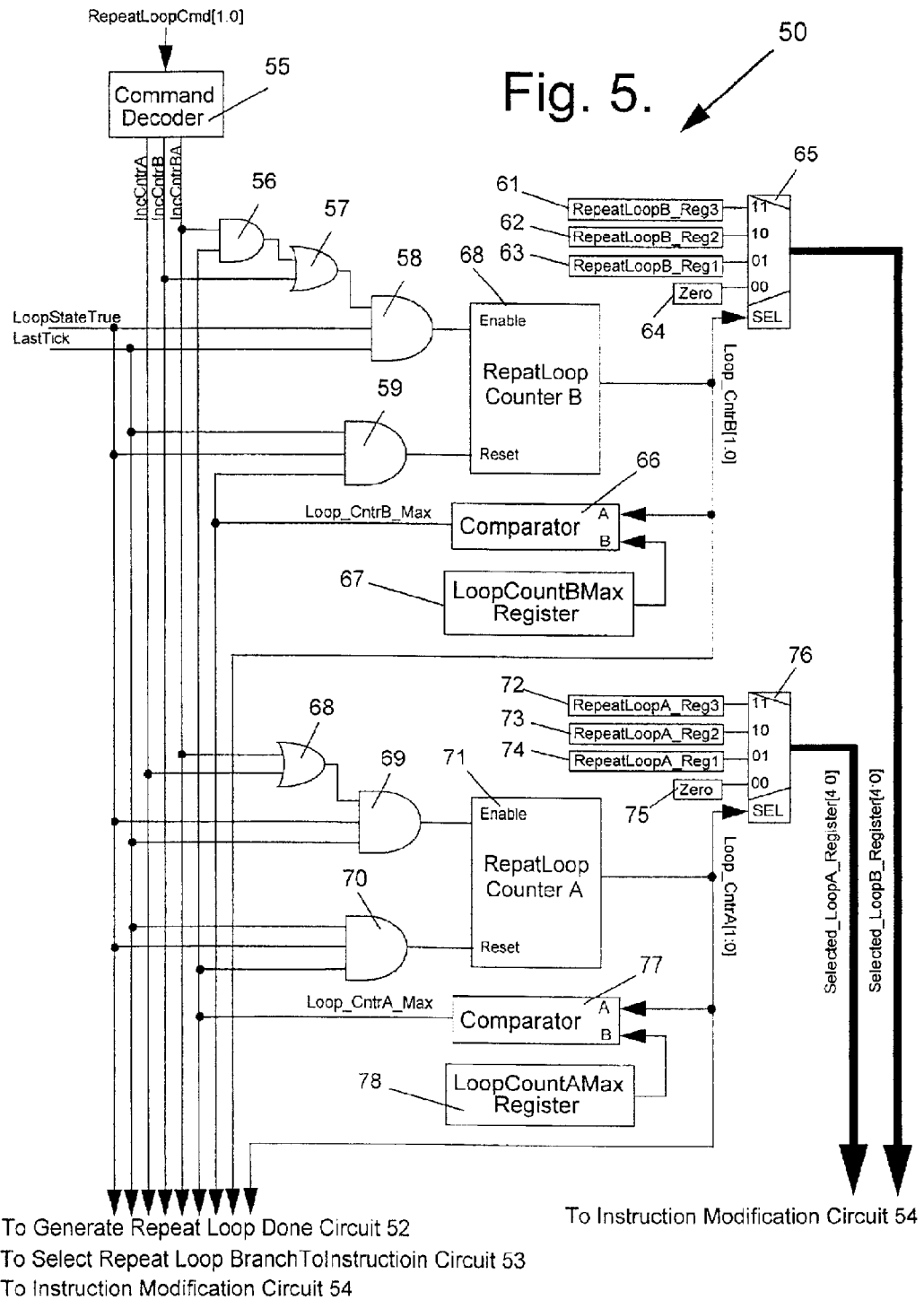
FIG. 5 is a diagrammatic view of a repeat loop sub-circuit according to an embodiment of the present invention.

FIG. 5 illustrates the architecture of Repeat Loop circuit 50. The repeat loop circuit architecture comprises a Command Decoder 55 and two nearly identical units called Repeat Loop A and Repeat Loop B. Command Decoder 55 receives the 2-bit RepeatLoopControl signal from the instruction in instruction execution register 34. The RepeatLoopControl generates the binary signal values given in TABLE V for signals IncCntrA, IncCntrB, IncCntrBA when decoded:

TABLE V

| RepeatLoopControl | IncCntrA | IncCntrB | IncCntrBA |
|---|---|---|---|
| 00 | 0 | 0 | 0 |
| 01 | 1 | 0 | 0 |
| 10 | 0 | 1 | 0 |
| 11 | 0 | 0 | 1 |

The 2-bit RepeatLoopControl field is decoded to perform one of four functions in the repeat loop circuit as specified in TABLE II. '00' performs a HOLD function which does not change the state of the repeat loop circuit; '01' instructs 2-bit counter 71 in Repeat Loop A to count; '10' instructs 2-bit counter 60 in Repeat Loop B to count; and '11' instructs counter 60 in Repeat Loop B and counter 71 in Repeat Loop A to count in such a manner that the two 2-bit counters form a single 4-bit counter. In this 4-bit counter, counter 71 from Repeat Loop A contains the two least significant bits and counter 60 from Repeat Loop B contains the two most significant bits.

Repeat Loop B is comprised of three AND gates 56, 58, and 59, one OR gate 57, 2-bit counter 60, four 5-bit repeat loop registers 61, 62, 63, and 64, a 4-to-1 multiplexer 65, a 2-bit comparator 66, and a 2-bit LoopCountBMax register 67. AND gates 56 and 59 and OR gate 57 perform the logic function:

IncCntrBA AND Loop_CntrA_Max

OR

IncCntrB AND LoopStateTrue AND LastTick.

This logic function enables counter 60 to increment the count value by one when RepeatLoopControl specifies incrementing counter BA and Repeat Loop Counter A has reached its maximum value OR, when the RepeatLoopControl is to increment counter B. The remaining two signals ensure that the counter only counts when the LoopStateTrue condition from the pointer control is '1' and on an active LastTick signal, indicating the end of an operation performed on the memory, has been issued. AND gate 59 performs the logic function:

Loop_CntrB_Max AND LoopStateTrue AND LastTick

Signal Loop_CntrB_Max is the output of comparator 66 which compares the count value from the counter 60 with the maximum count value initialized in the LoopCountBMax register 67. This logic function resets counter 60 to '00' when the counter has reached the maximum count value initialized in the LoopCountBMax register 67. The output of counter 60 is the select input of a 4-to-1 multiplexer used to select one of four 5-bit repeat registers 61, 62, 63, or a register 64 containing all zeros. Initially, register 64 is selected because counter 60 is reset and contains the value '00'. When the output of counter 60 is '01', register 61 is the output of the 4-to-1 multiplexer 65. When the output of counter 60 is '10', register 62 is the output of the multiplexer. When the output of counter 60 value is '11', register 63 is the output of the multiplexer.

Repeat Loop A is comprised of two AND gates 69, and 70, one OR gate 68, 2-bit counter 71, four 5-bit repeat loop registers 72, 73, 74, and 75, a 4-to-1 multiplexer 76, a 2-bit comparator 77, and a 2-bit LoopCountAMax register 78. AND gate 69 and OR gate 68 perform the logic function:

(IncCntrBA OR IncCntrA) AND LoopStateTrue AND LastTick

This logic function enables counter 71 to increment its count value by one when the RepeatLoopControl field specifies incrementing counter BA OR when the RepeatLoopControl specifies incrementing counter 71. Again, the remaining two signals ensure that the counter only counts when the LoopStateTrue condition from the pointer control is '1' and at the LastTick signal which indicates the end of an operation performed on the memory. AND gate 70 performs the logic function:

Loop_CntrA_Max AND LoopStateTrue AND LastTick

The signal Loop_CntrA_Max is the output of the comparator 77 which compares the count value from counter 71 with the maximum count value initialized in LoopCountAMax register 78. This logic function resets the counter 71 to '00' when the counter has reached the maximum count value initialized in LoopCountAMax register 78.

The output of counter 71 is the select input of the 4-to-1 multiplexer used to select one of the four 5-bit repeat registers 72, 73, 74, and a register 75 containing all zeros. Initially the register 75 is selected because counter 71 is reset and contains the value '00'. When the output of counter 71 value is '01', the register 72 is the output of the 4-to-1 multiplexer; when the output of counter 71 value is '10', register 73 is the output of the multiplexer; when the output of counter 71 value is '11', register 74 is the output of the multiplexer.

Repeat Loop Done Circuit

Figure 6:
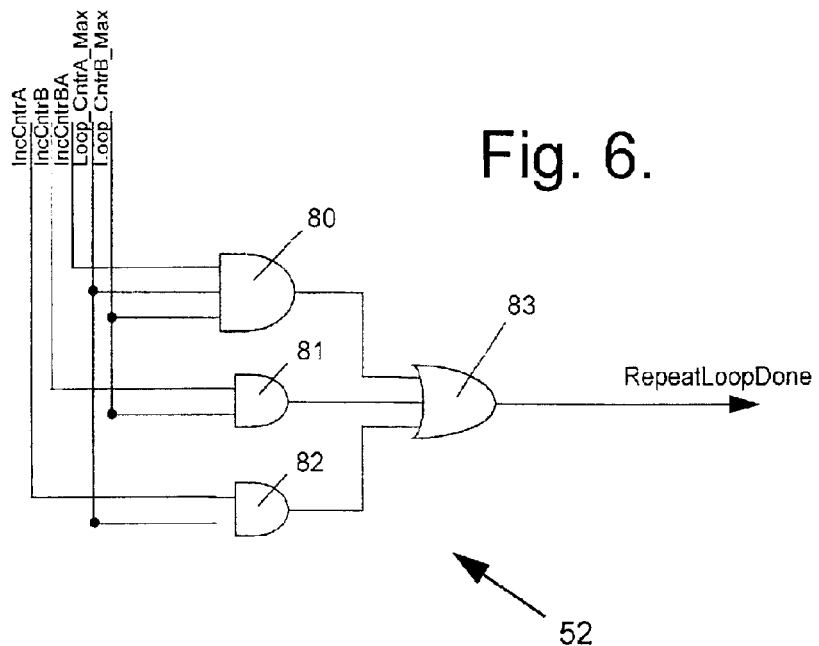
FIG. 6 is a diagrammatic view of a repeat trigger sub-circuit according to an embodiment of the present invention.

Repeat loop done circuit 52, illustrated in FIG. 6, generates control signal, RepeatLoopDone, which is input to pointer controller 16. The RepeatLoopDone signal is used in pointer controller 16 to indicate whether repeat loop module 26 has completed execution (logic 1) or has not completed (logic 0). As shown in FIG. 6, the circuit comprises a three-input AND gate 80, two 2-input AND gates 81 and 82, and a 3-input OR gate 84. The inputs to the repeat loop done circuit are IncCntrBA signal from command decoder 55, the Loop_CntrA_Max signal generated by comparator 78, and the Loop_CntrB_Max signal from comparator 67. AND gate 80 performs a logical AND of signals IncCntrBA, Loop_CntrA_Max, and Loop CntrB_Max, indicating when both repeat loop counters 60 and 71 have reached their respective maximum values and the repeat loop command is "11". AND gate 81 performs a logical AND of the signals IncCntrB and Loop_CntrB_Max indicating when counter 60 has reached its maximum value and the RepeatLoopControl command is '10'. AND gate 82 performs a logical AND of signals IncCntrA and Loop_CntrA_Max indicating when repeat loop counter 71 has reached the maximum value and the RepeatLoopControl command is '01'. OR gate 84 performs a logical OR of the outputs of AND gates 80, 81 and 82. The output of OR gate 83 is the RepeatLoopDone signal. These gates perform the logic function:

IncCntrBA AND Loop_CntrA_Max AND Loop_CntrB_Max

OR (IncCntrB AND Loop_CntrB_Max)

OR (IncCntrA AND Loop_CntrA_Max)

Select Repeat Loop BranchToInstruction Circuit

Select Repeat Loop BranchToInstruction circuit 53 selects an instruction pointer, RepeatLoop_BranchToInstruction, which is input to pointer controller 16. The Repeat-BranchToInstruction signal provides an instruction address of an instruction to be loaded for execution. The RepeatLoop_BranchToInstruction is loaded for execution by pointer controller 16 when Next_Conditions_True is '0' and the RepeatLoop_Conditions_True (see FIG. 3) is logic 1. When only Repeat Loop A is active, the address of the first instruction in that loop must be output. Similarly, when only Repeat Loop B is active, the address of the first instruction in that loop must be output. When both loops are active (one loop is nested within the other), the address of the first instruction of the first loop is selected to start the repeat operation. When the first loop has completed executing, the address of the first instruction of the second loop must be selected to begin its repeat operation.

As shown in FIG. 7, the circuit comprises of a BranchToInstruction register 84 for repeat loop A, a BranchToInstruction register 85 for repeat loop B, a 2-input AND gate 86, a 2-input OR 87, and a 2-to-1 multiplexer 88. The inputs to select repeat loop BranchToInstruction circuit 53 are the IncCntrBA signal from command decoder 55, the IncCntrB signal from command decoder 55, and the Loop_CntrA_Max signal generated by comparator 77. AND gate 86 performs the logic function:

Loop_CntrA_Max AND IncCntrBA

Signal Loop_CntrA_Max is the output of comparator 77 which compares the count value from counter 71 with the maximum count value initialized in LoopCountAMax register 78. Signal IncCntrBA is decoded from the RepeatLoop-Control field by command decoder 55 and activates both repeat loops, as mentioned earlier. The output of AND gate 86 indicates that the repeat loop B counter 71 will be enabled to count since repeat loop A counter 60 has reached is maximum value and the repeat loop command instructs both repeat loop B counter 71 and repeat loop A counter 60 to increment. Thus, repeat loop B counter 71 will count and RepeatLoopB_BranchToInstruction will be selected.

OR gate 87 performs a logical OR of the output of AND gate 86 and the IncCntrB signal. The output of OR gate 87 is the select signal for 2-to-1 multiplexer 88. The select signal for multiplexer 88 selects RepeatLoopA_BranchToInstruction 84 register or the RepeatLoopB_BranchToInstruction register 85. Registers 84 and 85 each contain an instruction address which is selected by multiplexer 88. The output of multiplexer 88 is the RepeatLoop_BranchToInstruction signal.

Instruction Field Modification Circuit

Instruction field modification circuit 54 performs instruction field modifications to the following fields in the executing instruction: Z_Address_Cmd, X1_Address_Cmd, X0_Address_Cmd, Y1_Address_Cmd, Y0_Address_Cmd, WriteDataCmd, ExpectDataCmd, InhibitDataCompare, and InhibitLastAddressCount. The modifications to these instruction fields is dependant on the selected register from Loop A and the selected register from Loop B of repeat loop circuit 50. When a bit in the selected register of Loop A is a logic '1', the corresponding instruction field is to be modified and when the bit is a logic '0', the corresponding instruction field is to not be modified. The same applies to the selected register of Loop B.

Figure 8:
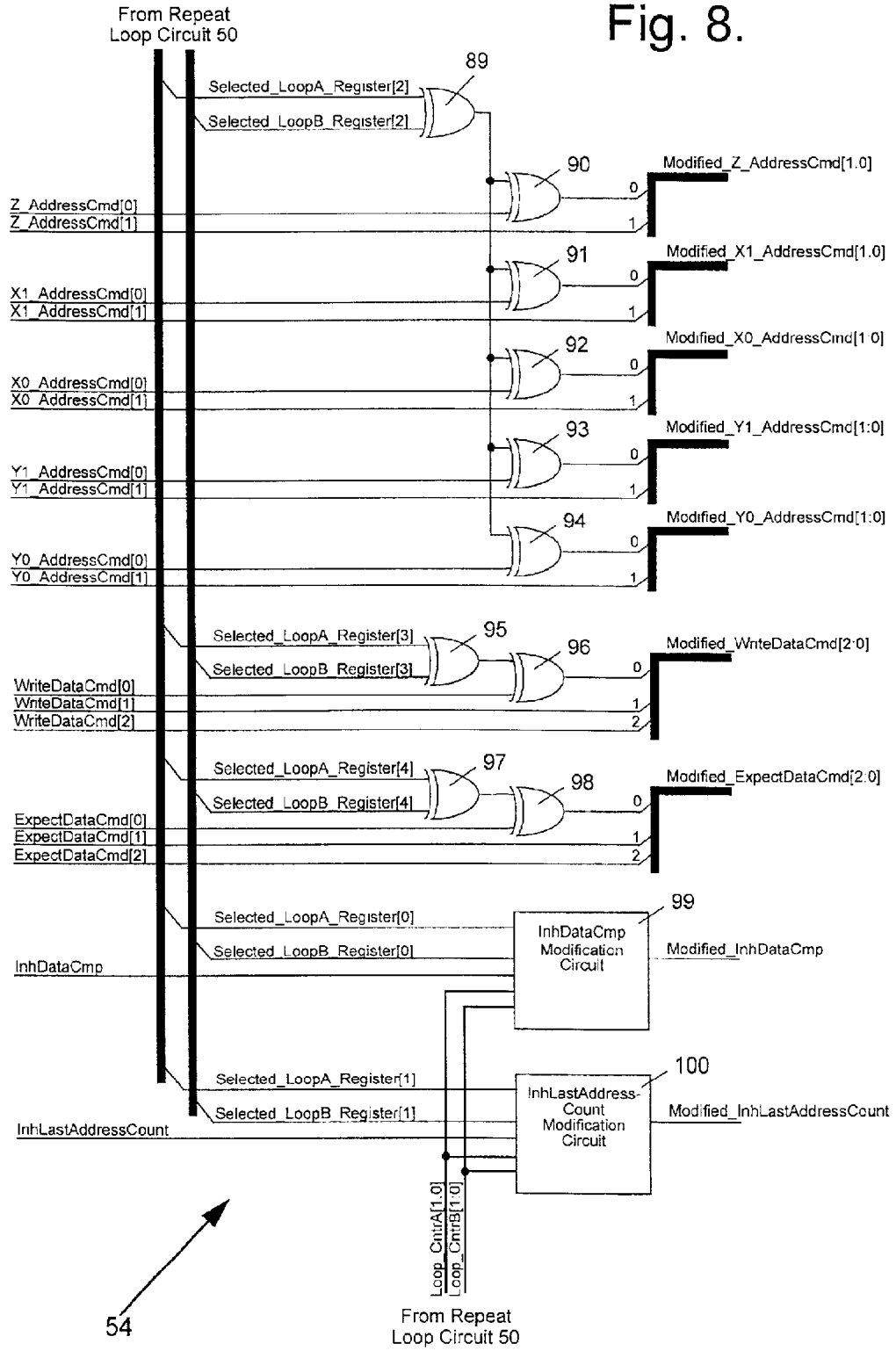
FIG. 8 is a circuit diagram of a repeat loop instruction field modification sub-circuit according to an embodiment of the present invention.

As shown in FIG. 8, the Instruction Field Modification Circuit 54 comprises ten XOR gates 89, 90, 91, 92, 93, 94, 95, 96, 97, 98, an InhibitDataCompare modification circuit 99, and an InhibitLastAddressCount modification Circuit 100.

Bit 4 from the selected Loop A register and of the selected Loop B register modify bit 0 of the ExpectDataCmd instruction field. As previously discussed, the ExpectDataCmd instruction field is a 3-bit field with up to eight unique decodes. These eight ExpectDataCmd decodes are paired such that the function of a given decode and its complement function differ only with bit 0 of the ExpectDataCmd field. Thus, modifying bit 0 of the ExpectDataCmd field results in the complement function replacing the function instructed to be performed by the ExpectDataCmd field. EXCLUSIVE-OR gate 97 performs a logical XOR between bit 4 of the selected Loop A register and bit 4 of the selected Loop B register. Since there are multiple repeat loop structures which may be nested, bit 4 of the selected Loop B register and bit 4 of the selected Loop A register are EXCLUSIVE-ORed.

If selected Loop A register bit 4 is 0 and selected Loop B register bit 4 is '0', the output of XOR gate 97 is '0', indicating that no modification is required. If the selected Loop A register bit 4 is '0' and selected Loop B register bit 4 is '1', the output of the XOR gate 97 is '1', indicating that a modification is required. Similarly, if the selected Loop A register bit 4 is '1' and the selected Loop B register bit 4 is '0', the output of the XOR gate 97 is '1', indicating that a modification is required. If the selected Loop A register bit 4 is '1' and selected Loop B register bit 4 is '1' the output of the XOR gate 97 is '0', indicating that both repeat loops require a modification which cancel each other out and no modification is performed. XOR gate 98 performs the inversion of the ExpectDataCmd field bit 0 when the output of XOR gate 97 is a '1'. When the output of XOR gate 97 is '0', bit 0 of the ExpectDataCmd field remains unchanged.

Bit 3 from the selected Loop A register and selected Loop B register modifies the WriteDataCmd instruction field bit 0. As previously discussed, the WriteDataCmd instruction field is a three-bit field with up to eight unique decodes. The eight WriteDataCmd decodes are paired such that the function of a given decode and its complement function differ only with bit 0 of the WriteDataCmd field. Thus, modifying bit 0 of the WriteDataCmd field results in the complement function replacing the function instructed to be performed by the WriteDataCmd field. EXCLUSIVE-OR gate 95 performs a logical XOR between the bit 3 of the selected Loop A register and bit 3 of the selected Loop B register. Since there are multiple repeat loop structures which may be nested, both the selected Loop B register bit 3 and the selected Loop A register bit 3 are EXCLUSIVE-ORed.

If selected Loop A register bit 3 is '0' and selected Loop B register bit 3 is '0', the output of the XOR gate 95 is '0', indicating that no modification is required. If bit 3 of the selected Loop A register is '0' and bit 3 of the selected Loop B register is '1', the output of the XOR gate 95 is '1', indicating that a modification is required. If bit 3 of the selected Loop A register is '1' and bit 3 of the selected Loop B register is '0', the output of the XOR gate 95 is '1', indicating that a modification is required. If bit 3 of the selected Loop A register is '1' and bit 3 of the selected Loop B register is '1', the output of the XOR gate 95 is '0', indicating that both repeat loops require a modification which cancel each other out and, therefore, no modification is performed. XOR gate 96 performs the inversion of the WriteDataCmd field bit 0 when the output of XOR gate 95 is a '1'. When the output of XOR gate 95 is '0', bit 0 of the WriteDataCmd field remains unchanged.

Bit 2 from the selected Loop A register and selected Loop B register modify bit 0 of the address instruction fields, Z_AddressCmd, X1_AddressCmd, X0_AddressCmd, Y1_AddressCmd, and Y0_AddressCmd. As previously discussed, the address command fields for the address segments Z, X1, X0, Y1, and Y0 are two-bit fields with each having up to four unique decodes. These four decodes are paired such that the function of a given decode and its complement function differ only with bit 0 of the instruction field. Thus, modifying bit 0 of the address command fields results in the complement function replacing the function instructed to be performed. EXCLUSIVE-OR gate 89 performs a logical XOR between the selected Loop A register bit 2 and the selected Loop B register bit 2. Since there are multiple repeat loop structures which may be nested, both the selected Loop B register bit 2 and the selected Loop A register bit 2 are EXCLUSIVE-ORed.

If bit 2 each of the selected Loop A and B registers is '0', the output of XOR gate 89 is '0' indicating that no modification is required. If bit 2 of the selected Loop A register is '0' and that of the selected Loop B register is '1', the output of the XOR gate 89 is '1' indicating that a modification is required. If bit 2 the selected Loop A register is '1' and that of the selected Loop B register is '0', the output of XOR gate 89 is '1', indicating that a modification is required. If bit 2 of both selected registers is '1', the output of XOR gate 89 is '0', indicating that both repeat loops require a modification. The two cancel each other and no modification is performed. XOR gates 90, 91, 92, 93, and 94 perform the inversion of bit 0 of the respective Z_AddressCmd, X1_AddressCmd, X0_AddressCmd, Y1_AddressCmd, and Y0_AddressCmd fields when the output of XOR gate 89 is a '1'. When the output of XOR gate 89 is '0' bit 0 of the address command fields is unchanged.

Bit 0 from the selected Loop A register and selected Loop B register modifies the InhibitDataCompare field. The modification to the InhibitDataCompare field is performed in the InhibitDataCompare Modification Circuit 99, described below with reference to FIG. 9. The InhibitDataCompare Modification Circuit 99 requires the Loop_CntrA and Loop_CntrB input signals from the Repeat Loop Circuit 50. Bit 1 from the selected Loop A register and of the selected Loop B register modify the InhibitLastAddressCount field. The modification to the InhibitLastAddressCount field is performed in the InhibitLastAddressCount Modification Circuit 100. InhibitLastAddressCount Modification Circuit 100 requires the Loop_CntrA and Loop_CntrB input signals from the Repeat Loop Circuit 50 (see FIG. 5).

InhibitDataCompare Modification Circuit

InhibitDataCompare Modification Circuit 99 performs the InhibitDataCompare instruction modifications. The modifications to these instruction fields is dependant on the selected Loop A register bit 0 signal and the selected Loop B register bit 0 signal from the Instruction Field modification circuit 54. The InhibitDataCompare instruction bit from the pointer controller 16 is replaced with the combination of bits from the selected Loop A register bit 0 and the selected Loop B register bit 0 signals.

Figure 9:
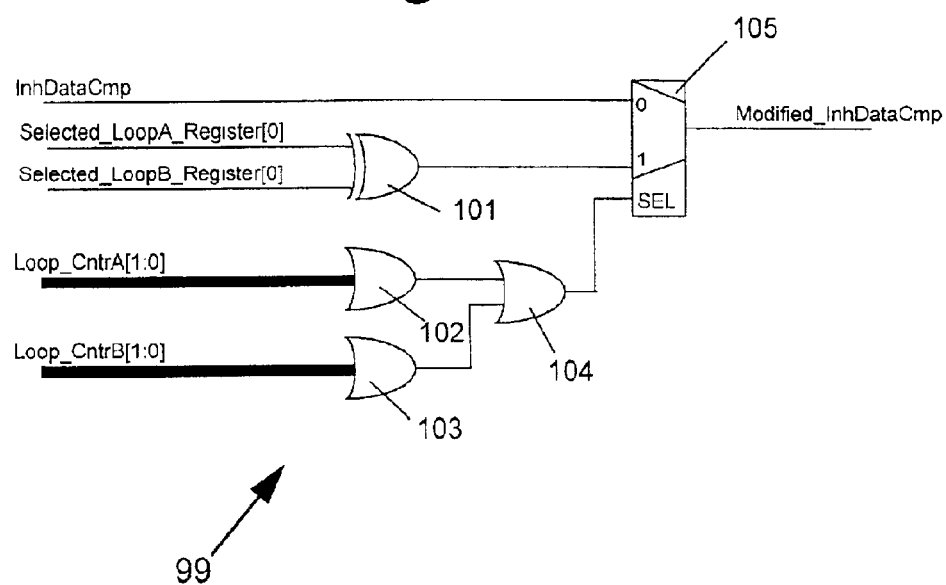
FIG. 9 is a circuit diagram of an InhibitDataCompare modification circuit according to an embodiment of the present invention.

As shown in FIG. 9, InhibitDataCompare Modification Circuit 99 comprises one XOR gate 101, three OR gates 102, 103, and 104, and a 2-to-1 multiplexer 105. The select input for multiplexer 105 is the output of the OR-tree comprising of the OR gates 102, 103, and 104. The OR tree detects if either of repeat loop A counter 71 or repeat loop B counter 60 is active or contains values greater than zero. If either of the repeat loop counters has a value greater than zero, the output of the OR gate 104 is a logic '1' and the multiplexer selects the output of the XOR gate 101. The XOR gate 101 combines bit 0 of the selected Loop A register and bit 0 of the selected Loop B register. If both of the repeat loop counters have a value of zero, the output of the OR gate 104 is a logic '0' and the multiplexer selects the InhibitDataCompare instruction command field from the pointer controller 16.

InhibitLastAddressCount Modification Circuit

InhibitLastAddressCount Modification Circuit 100 performs the InhibitLastAddressCount instruction field modifications. The InhibitLastAddressCount instruction bit from the pointer controller 16 is replaced with either the selected Loop A register bit 0 or the selected Loop B register bit 0 depending on which repeat loop is active.

Figure 10:
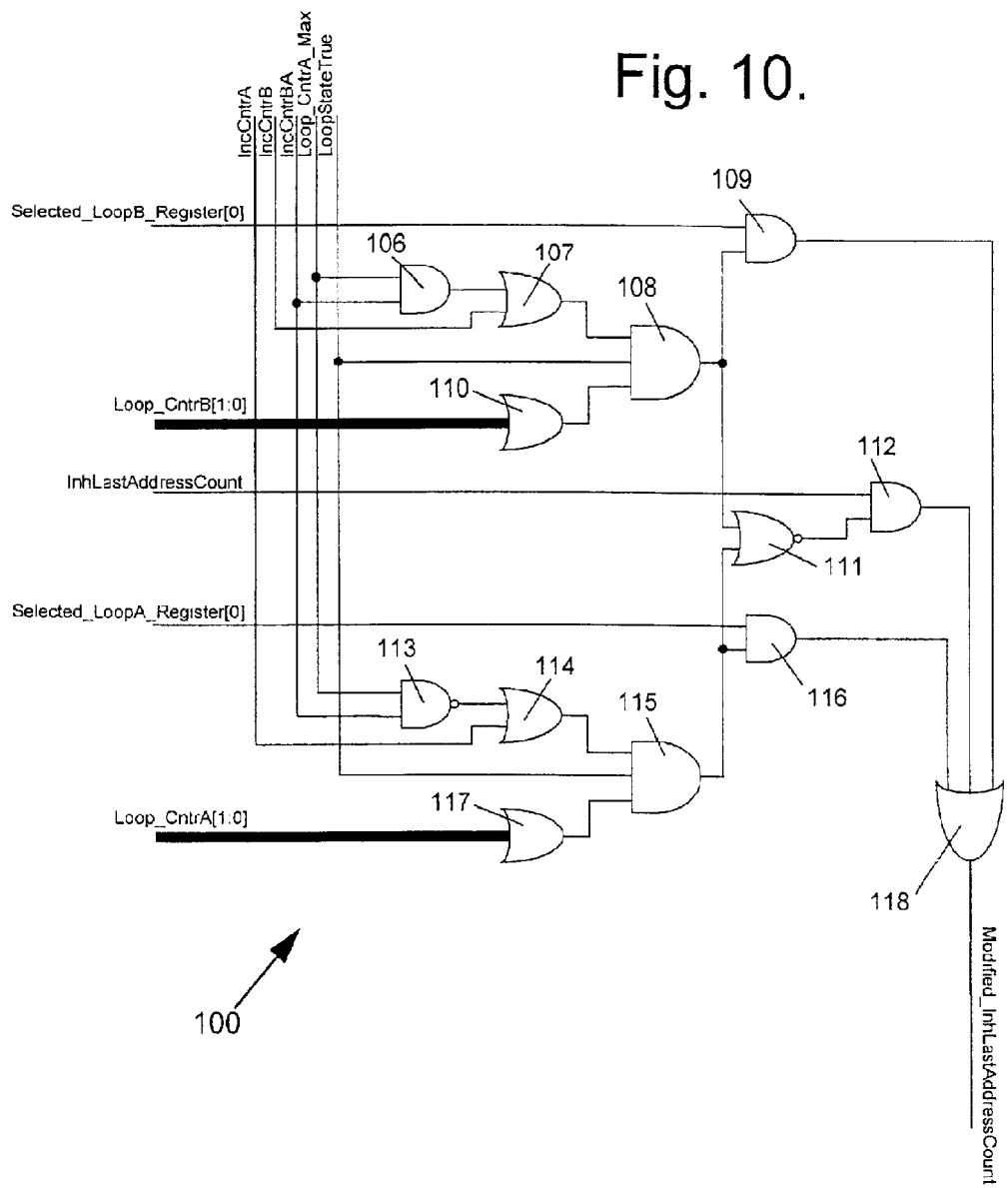
FIG. 10 is a circuit diagram of an InhibitLastAddress-Count modification circuit according to an embodiment of the present invention.

As shown in FIG. 10, InhibitLastAddressCount Modification Circuit 100 comprises five OR gates 107, 110, 114, 117, and 118, and six AND gates 106, 108, 109, 112, 114, and 116, NAND gate 113, and NOR gate 111. Only one of the three signals InhibitLastAddressCount, selected Loop A register bit 0, or selected Loop B register bit 0 is passed through the circuit at any given moment. These three signals are combined utilizing OR gate 118 since the active level of the Modified_InhibitLastAddressCount is a logical '1'. The output of the OR gate 118 is the Modified_InhibitLastAddressCount signal which is applied to Address Generator 24.

The first bit which may be passed through the circuit to drive the Modified_Inhibit-LastAddressCount signal is bit 0 from the selected Loop A register. This bit passes through the circuit on the last execution of a repeat loop before repeat loop A counter 71 increments. This bit is selected by OR gates 114 and 117, AND gate 115, and NAND gate 113. NAND gate 113 ensures that when the repeat loop command to the repeat circuit 50 is logical '11', which increment both repeat loop counters in repeat loops A and B, the Loop_CntrA_Max signal must be logical '0' meaning that the repeat loop A counter 71 will increment and not be reset. The output of NAND gate 113 performs a logical OR in OR gate 114 when the repeat loop command to the repeat circuit 50 is logical '01' to increment only the repeat loop A counter. If either of these conditions is True, the output of the OR gate 114 performs a logical AND in gate 115 which ensures that the InhibitLastAddressCount field replacement only occurs when repeat loop A counter 71 is greater than zero and the LoopStateTrue condition from the pointer controller 16 is logical '1'. The output from AND gate 115 then proceeds to the AND gate 116 which gates bit 0 of the selected Loop A register to OR gate 118.

The second bit which may be passed through the circuit to drive the Modified_Inhibit-LastAddressCount signal is bit 0 from the selected Loop B register. This bit passes through the circuit on the last execution of a repeat loop, before the repeat loop B counter 60 increments. This bit is selected utilizing OR gates 107 and 110, and two AND gates 106 and 108. The output of AND gate 106 performs a logical OR in OR gate 107 when the repeat loop command to repeat circuit 50 is logical '10' to increment repeat loop B counter. If either of these conditions is true, the output of OR gate 107 performs a logical AND in gate 108 which ensures that the InhibitLastAddressCount field replacement occurs only when repeat loop B counter 60 is greater than zero and the LoopStateTrue condition from the pointer controller 16 is logical '1'. The output from AND gate 108 then proceeds to AND gate 109 which gates bit 0 of the selected Loop B register to OR gate 118.

The third bit which may be passed through the circuit to drive the Modified_Inhibit LastAddressCount signal is the InhibitLastAddressCount signal from the pointer controller 16. This bit passes through the circuit when neither of the above two bits is enabled to pass through. This bit is selected utilizing NOR gate 111 and AND gate 112. NOR gate 111 ensures that neither of selected Loop A register bit 0 nor selected Loop B register bit 0 conditions enabling them to pass through the circuit is True. The output of NOR gate 111 proceeds to the AND gate 112 which gates the InhibitLastAddressCount signal to the OR gate 118.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth herein above are not intended to limit the breadth of the present invention, which should be inferred only from the following claims and their appropriately construed legal equivalents.

We claim:

1. A method of testing memory, comprising:
   executing each instruction of a plurality of test instructions in sequence, each said instruction having an inactive repeat control field except for a last instruction of each of one or more groups of one or more instructions to be repeated, each said last instruction having an active repeat control field;
   for each instruction having an active repeat control field:
   executing in sequence the instructions of the group of instructions with which said each instruction is associated for a predetermined number of repeat cycles for said group; and
   for each said repeat cycle, modifying predetermined fields of each instruction in accordance with a predetermined field modification instructions for each said repeat cycle.

2. A method as defined in claim 1, further including, prior to said executing each instruction:
   loading into a first repeat instruction address register, the address of the first instruction in the group of instructions;
   loading into a repeat cycle register a value indicating the number of repeat cycles to be performed for the group; and
   loading field modification commands for each repeat cycle into a field modification register associated with said each repeat cycle.

3. A method as defined in claim 1, said modifying predetermined fields including modifying the instruction field to a complementary value.

4. A method as defined in claim 3, said modifying predetermined fields including modifying the least significant bit of the instruction field to a complementary value.

5. A method as defined in claim 1, said modifying predetermined fields including, when a first group of instructions is nested within a second group of instructions, generating modified field modification instructions from the field modification instructions associated with said first and second groups.

6. A method as defined in claim 5, said generating modified field modification instructions including comparing corresponding modification instructions associated with each said repeat cycles and generating a no change instruction when corresponding instructions are the same and generating a change instruction when corresponding instructions are different.

7. A method of testing memory, comprising:
   loading a sequence of instructions into a sequence of instruction registers, each instruction having an inactive repeat control field except for the last instruction of each group of one or more instructions to be repeated;
   loading into a first repeat instruction address register the address of the first instruction in the group of instructions;
   loading into a register a value indicating a number of repeat cycles to be performed;
   for each said repeat cycles, loading field modification commands into an associated field modification register;
   executing each instruction of said sequence of instructions in sequence;
   for each instruction having an active repeat command:
   executing in sequence each instruction between and including the instruction located at the address stored in said address register and the instruction containing the said active repeat command for each of a number of repeat cycles specified in said repeat cycle register;
   for each repeat cycle, modifying predetermined fields of each instruction in accordance with field modification instructions stored in said associated cycle modification register.

8. A method as defined in claim 7, each said instructions having a next instructions field containing a one or more conditions fields for determining the next instruction to be executed.

9. A method as defined in claim 8, said next conditions field including a repeat loop done condition, said repeat loop done condition being active when said repeat control field is active and being inactive when said repeat control field is inactive.

10. A method as defined in claim 8, each said instructions further including address sequencing fields, an operation select field, an Inhibit Data Compare field, and an Inhibit Last Address Count field.

11. A method as defined in claim 10, said field modification instructions including a sequence of binary bits for modifying said address sequencing fields, operation select field, inhibit data compare and inhibit last address count fields.

12. In an memory test controller for testing a memory array, said controller having a test instruction register array having registers for storing a plurality of test instructions, each register having instruction fields for storing memory addressing sequencing data, write data sequencing data, expect data sequencing data and operation data specifying an operation to be performed on said memory array, the improvement comprising:
   a repeat module for repeating a group of one or more test instructions with modified data, said repeat module including storage means for storing instruction field modification data; and each register of said test instruction register array including an instruction field for enabling or disabling said repeat module.

13. In a memory test controller as defined in claim 12, said repeat module including first and second repeat loop circuits, each repeat loop circuit being operable for repeating a group of one or more instructions with modified data for each of a predetermined number of repeat cycles, each said repeat loop circuit including a plurality of storage registers for storing instruction modification data associated with each said repeat cycle.

14. In a memory test controller as defined in claim 13, each said repeat loop circuit including means for selecting said storage registers in predetermined sequence and outputting the contents thereof as repeat loop output data.

15. In a memory test controller as defined in claim 14, said means for selecting including a counter having a counter output and responsive to said an enable input, and a multiplexer having a select input for receiving said counter output and having inputs connected to each said storage registers and a null input.

16. In a memory test controller as defined in claim 13, said repeat module further including:
   means for combining the outputs of said repeat loop circuits to produce a repeat module output; and means for combining said repeat module output with corresponding current data to produce new instruction data for execution of said operation.

17. In an embedded memory test controller for an integrated circuit having embedded memory, the improvement comprising:
   first and second repeat loop circuits for use in repeating a respective group of test instructions, each repeat loop circuit having:
      a plurality of repeat registers for storing instruction field modification data for use in modifying said instructions of said respective group; and
      means for selecting each said repeat registers in predetermined sequence and outputting the contents thereof as selected modification data;
   means for enabling one or both of said first and second repeat loop circuits;
   means for combining the selected modification data output from said first and second repeat loop circuits with the repeat loop data output by the second repeat loop circuit to produce modified modification data; and
   means for modifying the contents of instruction fields of an instruction with the modified modification data output by said means for combining.

18. A memory test controller as defined in claim 17, said means for selecting including;
   a counter for producing a register select output up to a predetermined repeat cycle count; and
   a selector having a select input for receiving said register select output and outputting the contents of a selected repeat register.

19. A memory test controller as defined in claim 18, said means for enabling including a command decoder responsive to a repeat command for producing a repeat loop enabling signal for each said repeat loop circuits;
   means responsive to said enabling command and an active operation complete signal for causing each said counter to increment its count; and
   means for resetting each said counter when its count reaches said predetermined repeat cycle count.

20. A memory test controller as defined in claim 19, said means for combining the contents of a selected register being exclusive-OR gate means.

21. A memory test controller as defined in claim 17, further including means for asserting a repeat loop done signal when both of said repeat loop circuits have completed execution.

22. In an embedded memory test controller for an integrated circuit having embedded memory, the improvement comprising:
   an instruction repeat module having:
      first and second repeat loop circuits, each repeat loop circuit having:
         a plurality of repeat registers for storing instruction modification data associated with a repeat cycle;
         means for selecting one of said repeat registers and outputting selected instruction modification data including:
            means for storing the number of repeat cycles to be performed;
            a counter for incrementally producing a register select output up to a value stored in said means for storing; and
            a selector connected to each said repeat registers and having a select input for receiving said register select output and outputting the contents of a selected repeat register;
      means responsive to a repeat control field of a current instruction for enabling one or both of said first and second repeat loop circuits including:
         a command decoder responsive to said repeat control field for producing a repeat loop enabling signal for each said repeat loop circuits; and
         means responsive to said enabling command and an active operation complete signal for causing said counter in an active repeat loop circuit to increment its count; and
         means for disabling each said counter when its respective count reaches the value of stored in its respective means for storing;
      exclusive-OR gate means for modifying selected instruction modification data from each said repeat loop circuit to produce modified instruction modification data;
      means for generating a repeat loop done signal when both of said repeat loop circuits have completed execution; and
      means for modifying instruction fields of a current instruction with the modified instruction modification data output by said means for modifying.

23. In a test controller as defined in claim 22, each said repeat registers being a 5-bit register including one bit associated with five address sequencing command fields, one bit associated with a WriteData command field, one bit associated with an InhibitDataCompare command field and one bit associated with an InhibitLastAddressCount command field.

24. A test controller for use in testing memory imbedded in an integrated circuit, comprising:
   a scannable microcode register array having one or more instruction registers for storing a plurality of test instructions for performing a test of said memory in accordance with a predetermined test algorithm;
   a pointer controller for selecting one of said test instructions for execution and determining a next instruction for execution in accordance with conditions stored in each said test instruction;
   an instruction repeat module for reading address sequencing, write data sequencing, expect data sequencing data from a current test instruction and outputting address sequencing, write data sequencing, expect data sequencing data, said repeat module being responsive to instruction repeat data in said current test instruction for repeating an operation specified in said test instruction with different data;
   a sequencer responsive to an operation code in said current instruction for performing a predetermined operation on said memory under test; and
   an address generator and a data generator responsive to said output address sequencing, write data sequencing, expect data sequencing data for application to a memory under test in accordance with an operation specified in said current instruction.

25. A test controller as defined in claim 24, said repeat module including:
   at least one repeat loop circuit responsive to an instruction repeat control field for providing instruction modification commands for each of one or more instruction repeat cycles and including:
      first storage means for storing instruction field modification commands;
      second storage means for storing a number of repeat cycles to perform in a repeat operation;
   circuit means responsive to a pointer controller control signal and a sequencer control signal for enabling said repeat loop circuit;
   circuit means for signaling the end of an instruction repeat operation to said pointer controller;
   circuit means for providing an instruction address of the first instruction of a sequence of one or more instructions to be repeated; and
   circuit means for modifying instruction fields in accordance with said instruction field modification commands and outputting instructions to said address generator and a data generator.

26. A test controller as defined in claim 25, said module comprising two of said repeat loop circuits, each said repeat loop circuits having respective first and second storage means.

27. A test controller as defined in claim 26, said first storage means including a plurality of storage registers for storing a plurality of single-bit instruction modification commands, each said commands being associated with one or more instruction fields and each said storage registers being associated with one repeat cycle.

28. A test controller as defined in claim 27, each said repeat loop circuit further including means for selecting one of said storage registers for each repeat cycle, said means for selecting including a counter having a counter output and responsive to an enable input, and a multiplexer having a select input for receiving said counter output and having inputs connected to each said storage registers and a null input.

* * * * *